(12) United States Patent
Matsuyama

(10) Patent No.: US 6,215,545 B1
(45) Date of Patent: Apr. 10, 2001

(54) SUBSTRATE PROCESSING APPARATUS

(75) Inventor: Yuji Matsuyama, Kumamoto-ken (JP)

(73) Assignee: Tokyo Electron Limited (JP)

( * ) Notice: Subject to any disclaimer, the term of this patent is extended or adjusted under 35 U.S.C. 154(b) by 0 days.

(21) Appl. No.: 09/359,384

(22) Filed: Jul. 23, 1999

(30) Foreign Application Priority Data

Jul. 24, 1998 (JP) .................................................. 10-225239

(51) Int. Cl.$^7$ .......................... G03B 27/52; G03B 27/32; G03D 5/00; B05C 11/02
(52) U.S. Cl. .............................. 355/30; 355/27; 396/611; 118/52
(58) Field of Search ................................. 355/27–29, 30; 396/611, 624; 414/410, 414, 142, 222–225; 118/52, 58, 66, 666–668

(56) References Cited

U.S. PATENT DOCUMENTS

| | | | |
|---|---|---|---|
| 5,664,254 | * | 9/1997 | Ohkura et al. .................... 396/612 |
| 5,762,745 | * | 6/1998 | Hirose ................................ 156/345 |
| 5,826,129 | * | 10/1998 | Hasebe et al. .................... 396/611 |
| 5,876,280 | * | 3/1999 | Kitano et al. ...................... 454/187 |
| 5,972,110 | * | 10/1999 | Akimoto ............................. 118/52 |

FOREIGN PATENT DOCUMENTS 10-144763   5/1998 (JP) .

* cited by examiner

Primary Examiner—Russell Adams
Assistant Examiner—Hung Henry Nguyen
(74) Attorney, Agent, or Firm—Rader, Fishman & Grauer

(57) ABSTRACT

A first conveying unit, a second conveying unit, and a third conveying unit, each of which conveys a wafer, are disposed in parallel in a wafer processing unit. A first heat treatment unit group and a second heat treatment unit group are oppositely disposed with respect to the first conveying unit. A third heat treatment unit group and a fourth heat treatment unit group are oppositely disposed with respect to the third conveying unit. A developing process unit group and a resist coating unit group are oppositely disposed with respect to the second conveying unit. A first transferring table is disposed between the first conveying unit and the second conveying unit. A second transferring table is disposed between the second conveying unit and the third conveying unit. Since the second conveying unit conveys a wafer among the developing process unit group, the resist coating unit group, and each transferring table, thermal variation of the film thickness of a film of processing solution can be suppressed.

19 Claims, 8 Drawing Sheets

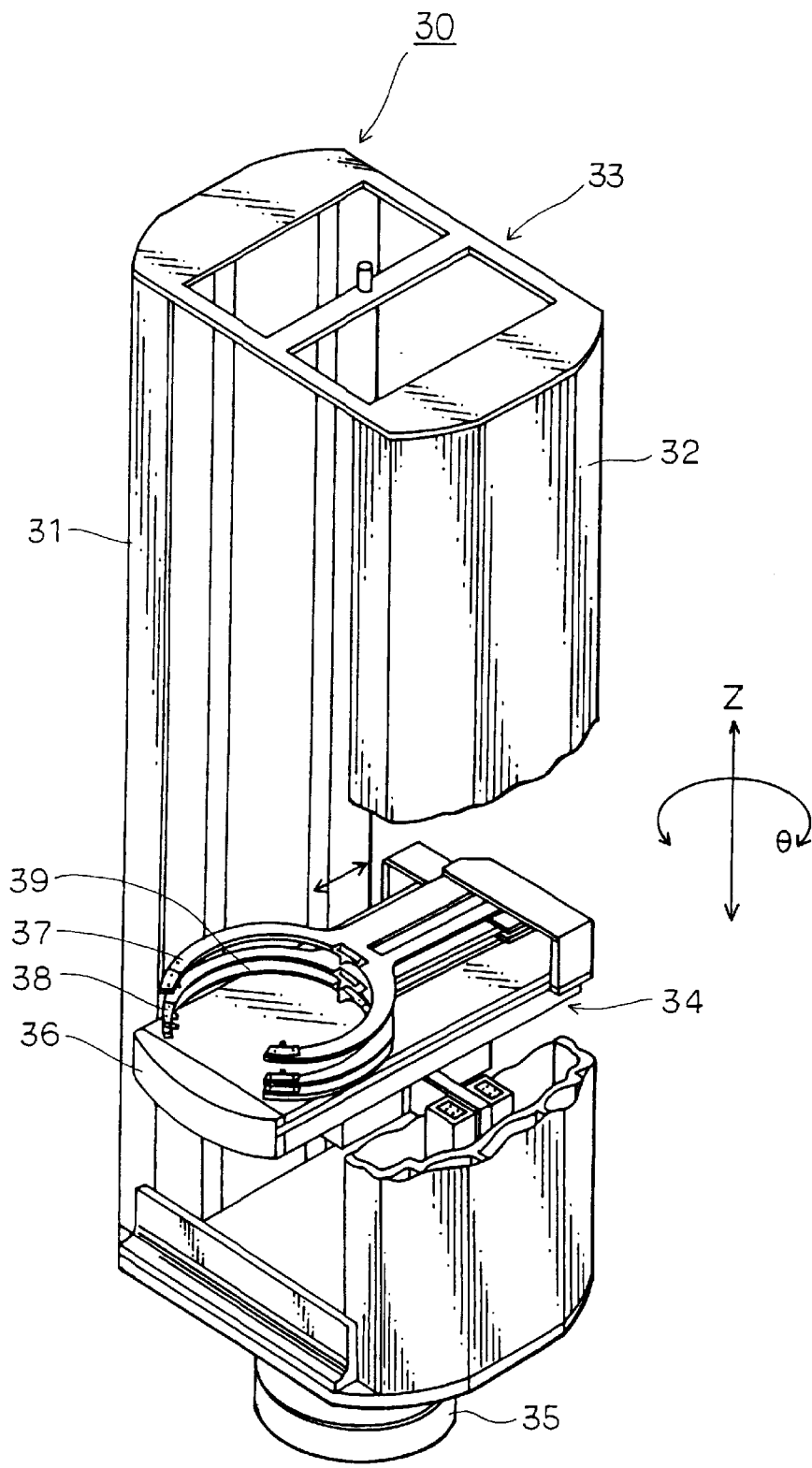
F I G. 3

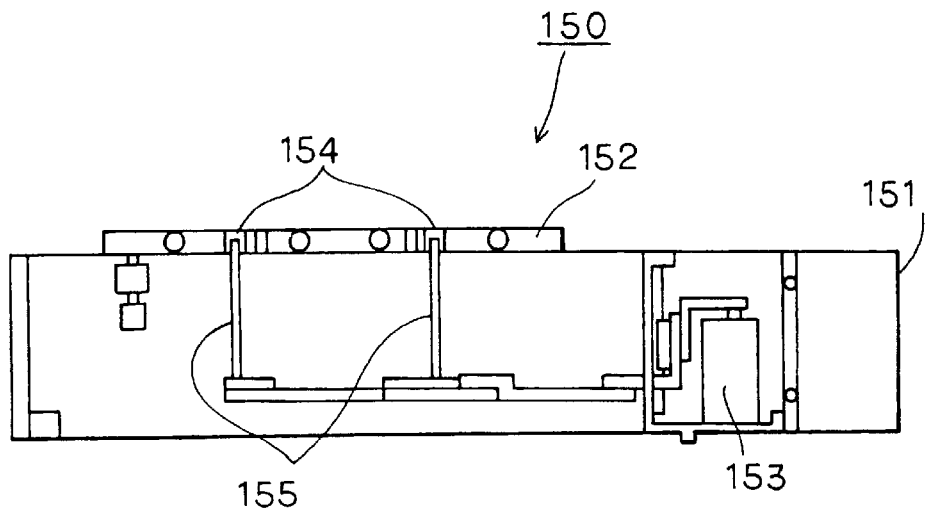
F I G. 7
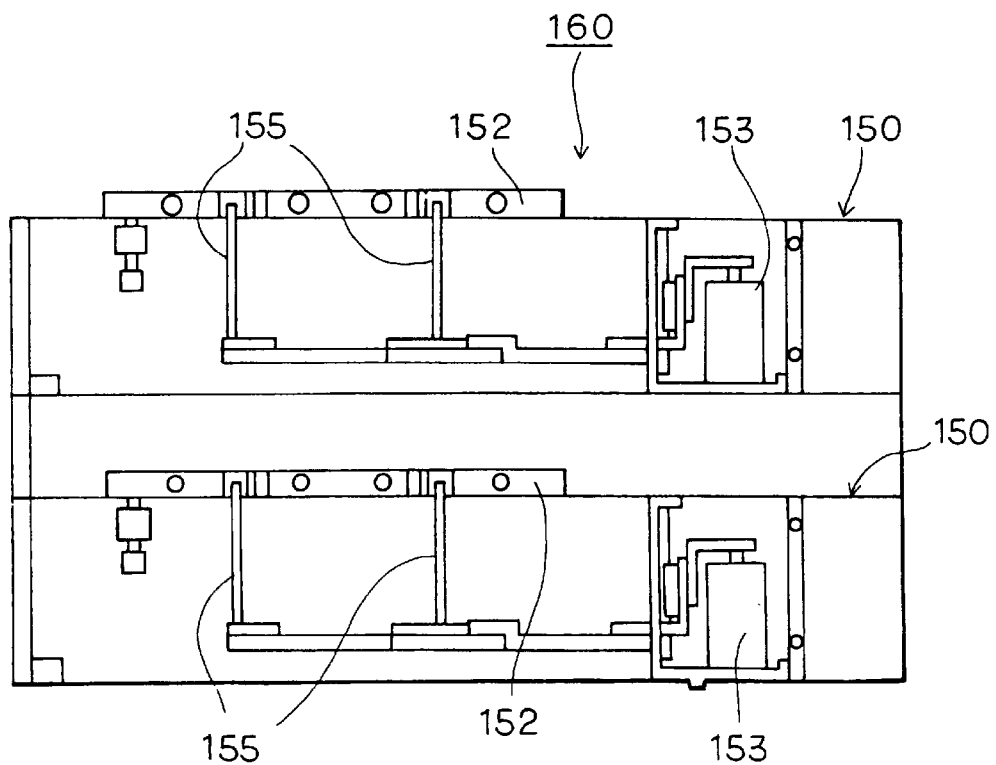
F I G. 8

SUBSTRATE PROCESSING APPARATUS

BACKGROUND OF THE INVENTION

1. Field of the Invention

The present invention relates to a substrate processing apparatus having a heat treatment unit, a solution processing unit, and a conveying unit.

2. Description of the Related Art

In a photoresist process of a semiconductor device fabrication, resist solution is coated to a substrate such as a semiconductor wafer (hereinafter referred to as wafer). The resist film is exposed so that a predetermined pattern is formed. The resultant wafer is developed with developing solution. To do these processing steps, a coating and developing apparatus has been used.

The coating and developing apparatus has a heat treatment unit and a solution process unit. The heat treatment unit performs a hydrophobic process for improving the adhesion of for example resist, a heating process for heating a wafer coated with resist solution and for hardening the resist film, and a cooling process for cooling a heated wafer. The solution process unit is for example a resist coating unit or a developing process unit. The resist coating unit coats resist solution to a wafer and forms a resist film. The developing process unit develops an exposed wafer with developing solution. A wafer is conveyed from the heat treatment unit to the solution process unit by a conveying unit. The conveying unit has for example three pincettes that are disposed at an upper position, a middle position, and a lower position of the conveying unit (hereinafter, these pincettes are referred to as upper pincette, middle pincette, and lower pincette). The conveying unit loads/unloads a wafer to/from the heat treatment unit or the solution process unit while holding the wafer with these pincettes.

The upper pincette is used for the conveying unit to unload a wafer from the resist coating unit. The middle and lower pincettes are used for the conveying unit to load/unload a wafer to/from the heat treatment unit. In such a structure, a wafer unloaded from the resist coating unit is not affected by heat of the pincette. Thus, the film thickness of a resist film that is sensitive against temperature can be prevented from varying.

However, when the diameter of a wafer becomes large, the amount of heat stored in the wafer becomes large. Thus, the amount of heat applied to the middle and lower pincettes is larger than that of a smaller diameter wafer. Consequently, the influence of the heat radiation of the middle and lower pincettes against the upper pincette cannot be ignored. In other words, the heat radiation causes the upper pincette to heat up. Thus, the film thickness of the resist film of the wafer held by the upper pincette may vary. To solve such a problem, for example, a heat insulating plate is disposed in a space between the upper pincette in and the middle pincette.

However, the space between the upper pincette and the middle pincette is narrow, and therefore it is difficult to dispose the heat insulating plate in such a space. In addition, when the heat insulating plate is disposed in the space, the conveying unit becomes large and complicated.

SUMMARY OF THE INVENTION

The present invention is made from the above-described point of view. An object of the present invention is to provide a substrate processing apparatus that suppresses the film thickness of such as a resist film of a processing solution coated on a substrate such as a wafer with a large diameter from varying without need to use a heat insulating member.

A first aspect of the present invention is a substrate processing apparatus, comprising at least one solution processing unit for supplying a processing solution to a substrate and processing the substrate with the supplied processing solution, at least one heat treatment unit for heat-treating a substrate at a predetermined temperature, and at least one conveying unit for conveying a substrate while holding it with a holding member, wherein the conveying unit has a first conveying unit for conveying a substrate between at least one transferring table and the heat treatment unit, and a second conveying unit for conveying a substrate between the transferring table and the solution processing unit, and wherein the transferring table is disposed between the first conveying unit and the second conveying unit.

According to the first aspect of the present invention, the second conveying unit conveys only a substrate that is not heated. The first conveying unit conveys a substrate that has been heated in the heat treatment. Thus, heat of a substrate is not stored in the holding member of the second conveying unit. Consequently, thermal variation of the film thickness of a film of the process solution formed on a substrate held by the holding member of the second conveying unit can be prevented. As a result, since a heat insulating member such as a heat insulating plate that has been used in the conventional apparatus is not required, the second conveying unit can be prevented from becoming large and complicated.

A second aspect of the present invention is a substrate process apparatus, comprising a developing and coating process block having a plurality of solution processing units, a first heat treatment block and a second heat treatment block disposed on both sides of the developing and coating block, each of the first heat treatment block and the second heat treatment block having a plurality of heat treatment units, a first conveying unit disposed in the first heat treatment block, a second conveying unit disposed in the second heat treatment block, a third conveying unit disposed in the developing and coating block, and a first transferring table for transferring a substrate between the third conveying unit disposed in the developing and coating block and the first conveying unit disposed in the first heat treatment block, and a second transferring table for transferring a substrate between the third conveying unit disposed in the developing and coating block and the second conveying unit disposed in the second heat treatment block.

According to the second aspect of the present invention, with the transferring table disposed in the developing and coating block, the conveying unit disposed therein and the conveying units disposed in the first heat treatment block and the second heat treatment block transfer a wafer convey a wafer. Thus, the conveying units disposed in the first heat treatment block and the second heat treatment block convey a wafer that is heated through the transferring table. Consequently, heat of the wafer that has been heat-treated does not directly affects the conveying unit disposed in the developing and coating block.

Therefore, thermal variation of the film thickness of a film of processing solution on a wafer in the developing and coating block can be prevented.

These and other objects, features and advantages of the present invention will become more apparent in light of the following detailed description of a best mode embodiment thereof, as illustrated in the accompanying drawings.

BRIEF DESCRIPTION OF DRAWINGS

FIG. 3 is a perspective view showing the structure of a second conveying unit of the coating and developing apparatus shown in FIG. 1;

FIG. 7 is a sectional view for explaining a modification of the transferring table shown in FIG. 6;

FIG. 8 is a sectional view for explaining another modification of the transferring table shown in FIG. 7.

DESCRIPTION OF THE PREFERRED EMBODIMENT

With reference to the accompanying drawings, the structure of a coating and developing apparatus according to an embodiment of the present invention will be described.

Figure 1:
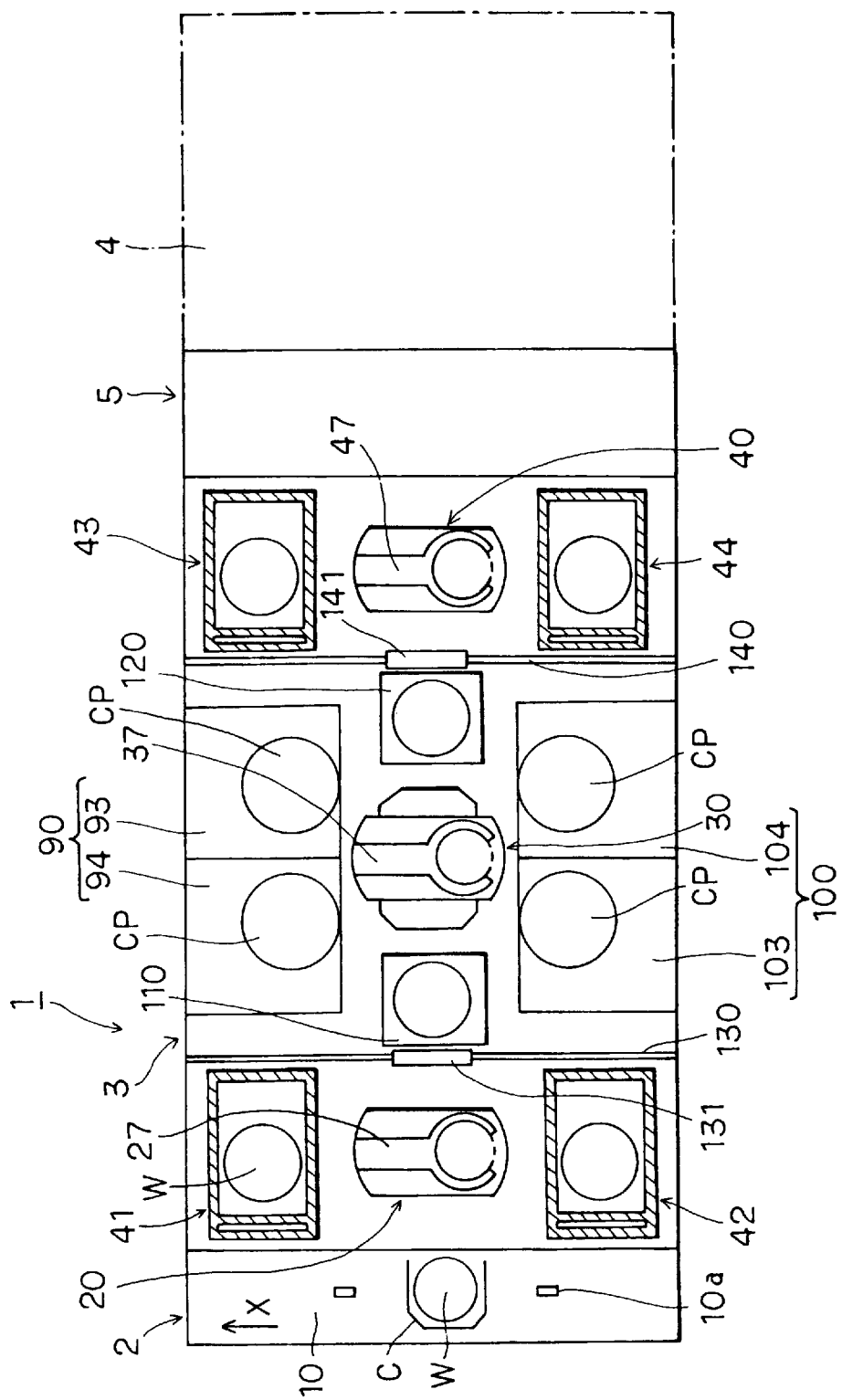
FIG. 1 is a plan view showing the structure of a coating and developing apparatus according to an embodiment of the present invention.

As shown in FIG. 1, the coating and developing apparatus 1 has a cassette station 2, a processing station 3, and an interface portion 5 that are integrally connected. The cassette station 3 loads and unloads a cassette C that accommodates for example 25 wafers w to and from the exterior of the apparatus. In addition, the cassette station 3 loads and unloads a wafer W to and from a cassette C. The processing station 3 has a variety of processing units that perform predetermined processes. The processing units are successively layered. The interface portion 5 transfers a wafer W from and to an exposing unit 4 disposed adjacent to the processing station 3.

In the cassette station 2, a cassette C can be placed at a protrusion 10a on a cassette table 10 as a mounting portion in such a manner that an access opening of the cassette C faces the processing station 3. Thus, a plurality of cassettes C can be placed at respective protrusions 10a arranged in the X direction (the vertical direction in FIG. 1).

Figure 2:
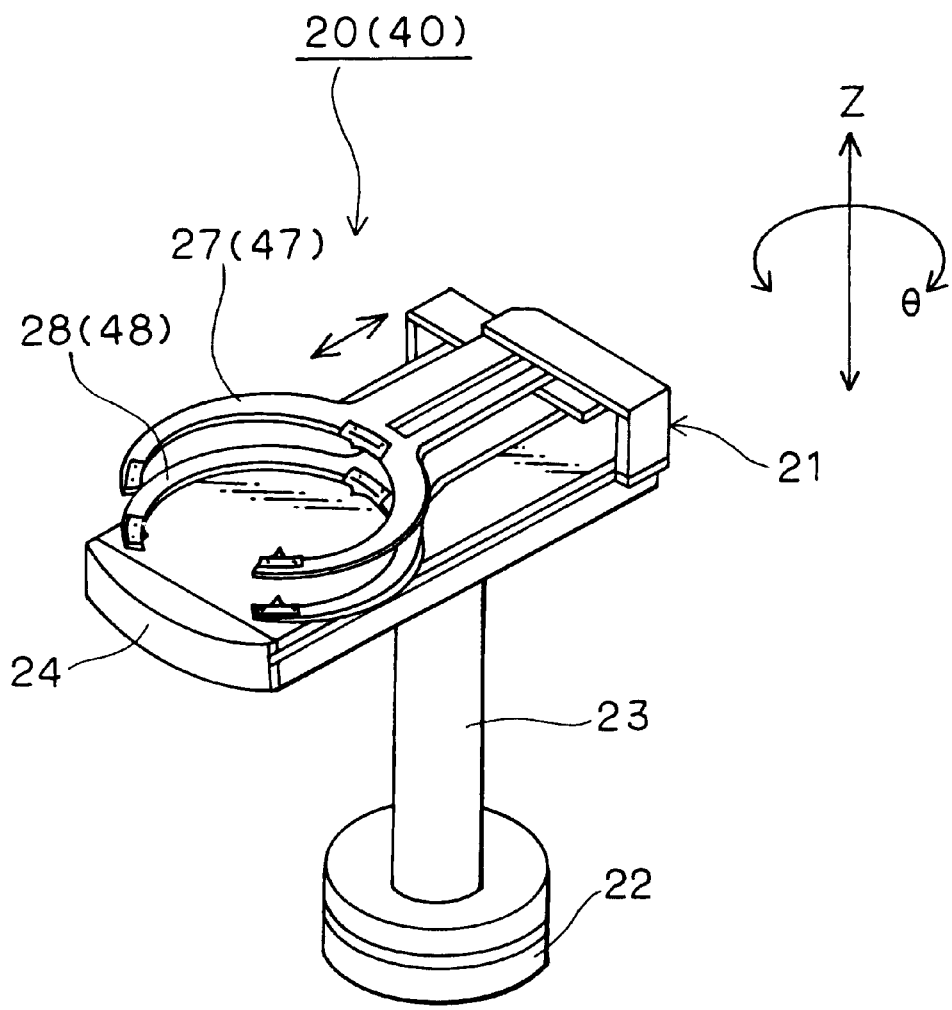
FIG. 2 is a perspective view showing the structure of a first conveying unit of the coating and developing apparatus shown in FIG. 1.

In the processing station 3, three conveying units that convey a wafer W are disposed in parallel. The three conveying units are a first conveying unit 20, a second conveying unit 30, and a third conveying unit 40. The structure of the first conveying unit 20 is basically the same as the structure of the third conveying unit 40. For simplicity, with reference to FIG. 2, the structure of only the first conveying unit 20 will be described. The first conveying unit 20 has a wafer conveying means 21 that vertically moves (in the Z direction in FIG. 2). The wafer conveying means 21 is supported by a rotating shaft 23 driven by a motor 22. The wafer conveying means 21 is rotatable in the θ direction in FIG. 2. Two pincettes 27 and 28 that hold a wafer W are disposed on a conveying pedestal 24 of the wafer conveying means 21. The structure of the pincette 27 is basically the same as the structure of the pincette 28. The wafer W is held by the pincettes 27 and 28. As mentioned above, pincettes 47 and 48 that have the same structures as the pincettes 27 and 28 of the first conveying unit 20 are disposed in the third conveying unit 40.

As shown in FIG. 3, the second conveying unit 30 has a wafer conveying means 34 that vertically moves (in the Z direction). The wafer conveying means 34 is disposed in a cylindrical supporting member 33 composed of a pair of wall portions 31 and 32. Upper edges and lower edges of the wall portions 31 and 32 are connected, respectively. The cylindrical supporting member 33 is connected to a rotating shaft of a motor 35. Rotating force of the motor 35 causes the cylindrical supporting member 33 and the wafer conveying means 34 to be integrally rotated around the rotating shaft of the motor 35. Thus, the wafer conveying means 34 is rotatable in the θ direction.

For example three pincettes 37, 38, and 39 as holding portions that hold a wafer W are disposed on a conveying pedestal 36 of the wafer conveying means 34. The structure of each of the pincettes 37, 38, and 39 is the basically the same. The wall portions 31 and 32 of the cylindrical supporting member 33 form a side opening portion in which each of the pincettes 37, 38, and 39 freely moves forward and backward by respective motors (not shown) disposed in the conveying pedestal 36.

Referring back to FIG. 1, in the processing station 3, a first heat treatment unit group 41 and a second heat treatment unit group 42 are oppositely disposed with respect to the first conveying unit 20. Likewise, a third heat treatment unit group 43 and a fourth heat treatment unit group 44 are oppositely disposed with respect to the third conveying unit 40.

Figure 4:
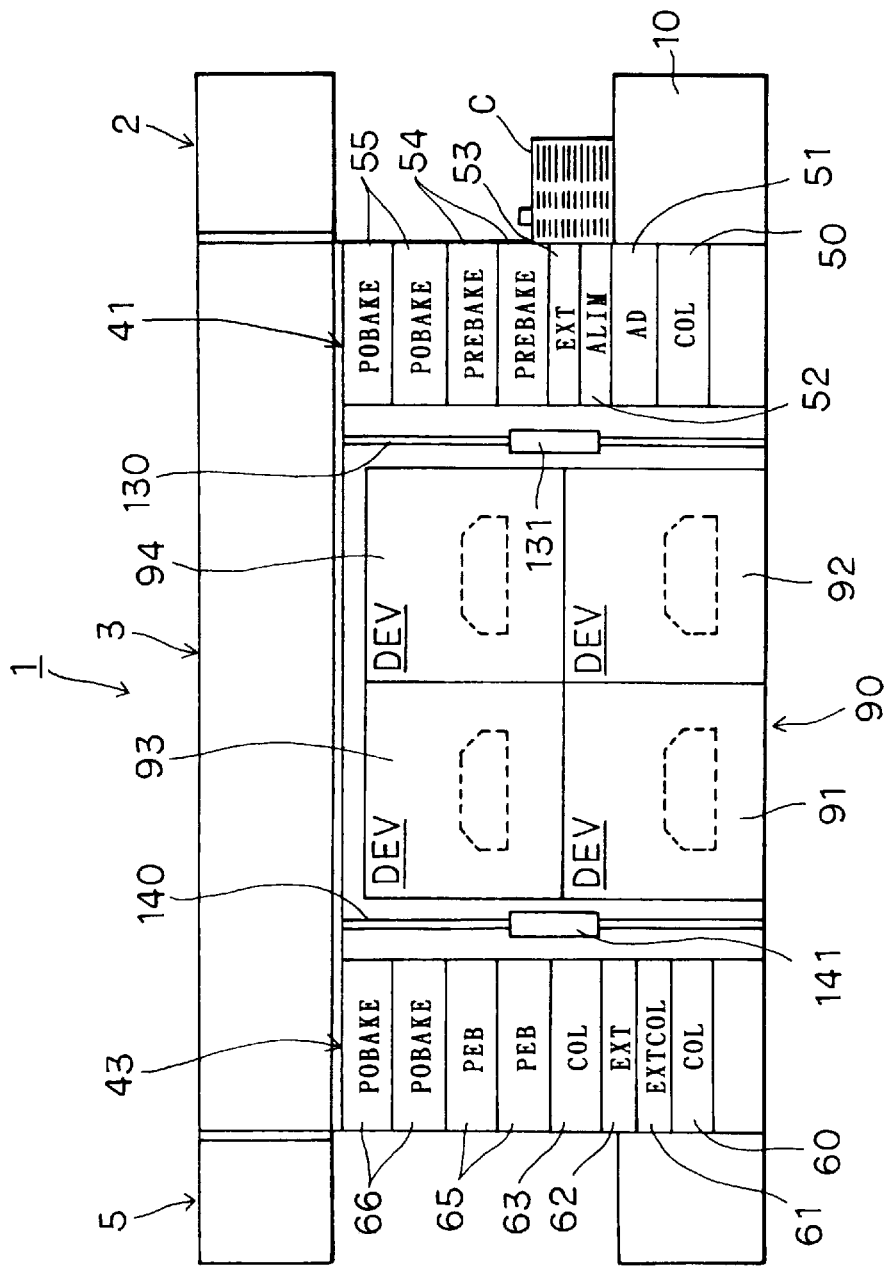
FIG. 4 is a rear view for explaining the structure of the coating and developing apparatus shown in FIG. 1.

Next, with reference to FIG. 4, the structures of the heat treatment unit groups 41 and 43 will be described. FIG. 4 is a rear view showing the structure of the coating and developing apparatus 1. The first heat treatment unit group 41 is composed of seven units that are a cooling unit 50, a hydrophobic processing unit 51, an aligning unit 52, an extension unit 53, two pre-baking units 54, and two post-baking units 55 that are successively layered from the bottom in this order. The cooling unit 50 cools a wafer W at a predetermined temperature. The hydrophobic process unit 51 improves the adhesion of a resist layer and a wafer W. The aligning unit 52 aligns a wafer W. The extension unit 53 temporarily stores a wafer W. Each of the pre-baking units 54 heats a wafer W coated with a resist at a predetermined temperature. Each of the post-baking units 55 heats a wafer W that has been developed. The third heat treatment unit group 43 is composed of seven units that are a cooling unit 60, an extension cooling unit 61, an extension unit 62, a cooling unit 63, two post-exposure baking units 65, and two post-baking units 66 that are successively layered from the bottom in this order. The extension cooling unit 61 naturally cools a wafer W. Each of the post-exposure baking units 65 heats a wafer W that has been exposed.

Figure 5:
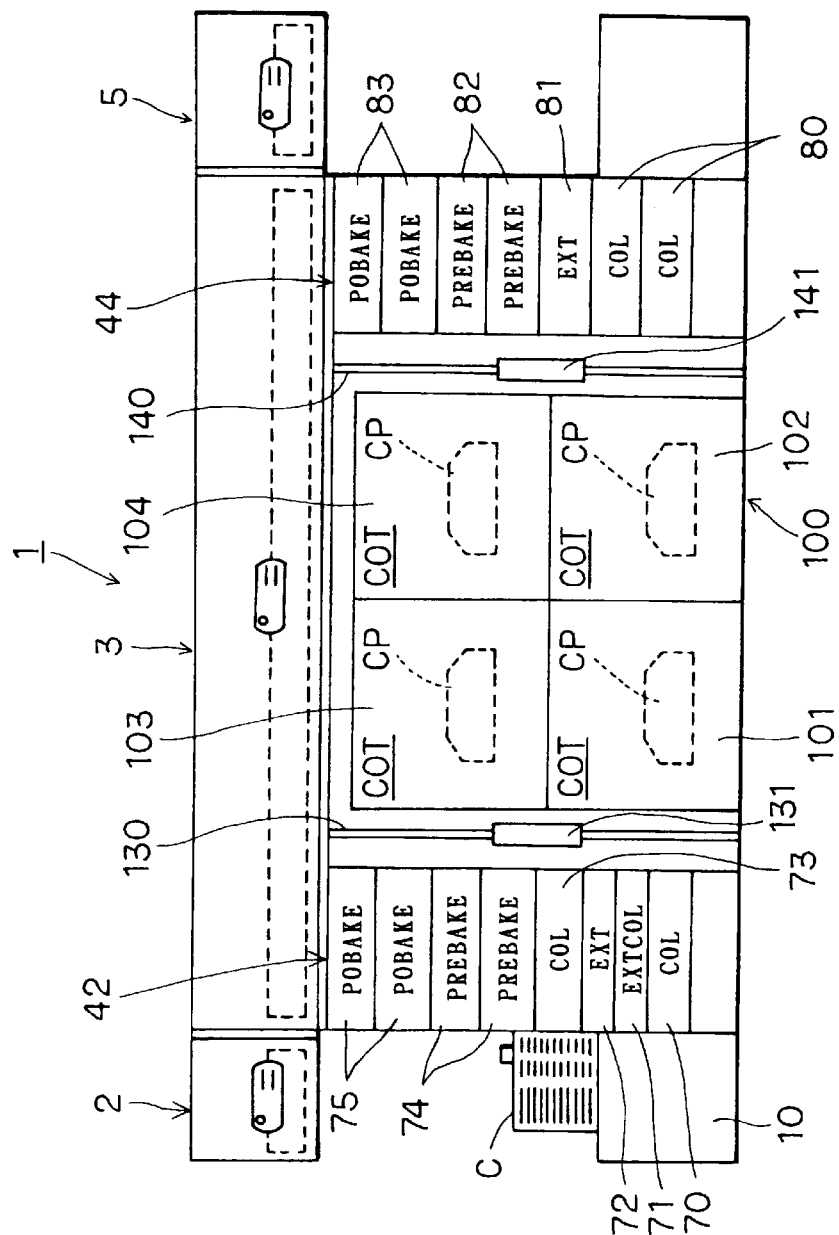
FIG. 5 is a front view for explaining the structure of the coating and developing apparatus shown in FIG. 1.

Next, with reference to FIG. 5, the structures of the heat treatment unit groups 42 and 44 will be described. FIG. 5 is a front view showing the structure of the coating and developing apparatus 1. The second heat treatment unit group 42 is composed of seven units that are a cooling unit 70, an extension cooling unit 71, an extension unit 72, a cooling unit 73, two pre-baking units 74, and two post-baking units 75 that are successively layered from the bottom in this order. The fourth heat treatment unit group 44 is composed of seven units that are two cooling units 80, an extension unit 81, two pre-baking units 82, and two post-baking units 83 that are successively layered from the bottom in this order.

Referring back to FIG. 1, a developing unit group 90 and a resist coating unit group 100 are oppositely disposed with respect to the second conveying unit 30. The developing unit 90 is disposed on the rear side of the coating and developing apparatus 1. The resist coating unit group 100 is disposed on the front side of the coating and developing apparatus 1.

The developing unit group 90 is composed of developing units 91, 92, 93, and 94. Each of the developing units 91, 92, 93, and 94 supplies a developing solution to a wafer W placed in a cup. The developing units 91 and 92 are adjacently disposed. The developing units 93 and 94 are adjacently disposed. The developing units 93 and 94 are layered on the developing units 91 and 92, respectively.

The resist coating unit group 100 is composed of resist coating units 101, 102, 103, and 104. Each of the resist coating units 101, 102, 103, and 104 coats a resist solution to a wafer W placed in a cup CP. The resist coating units 101 and 102 are adjacently disposed. The resist coating units 103 and 104 are adjacently disposed. The resist coating units 103 and 104 are layered on the resist coating units 101 and 102, respectively.

Figure 6:
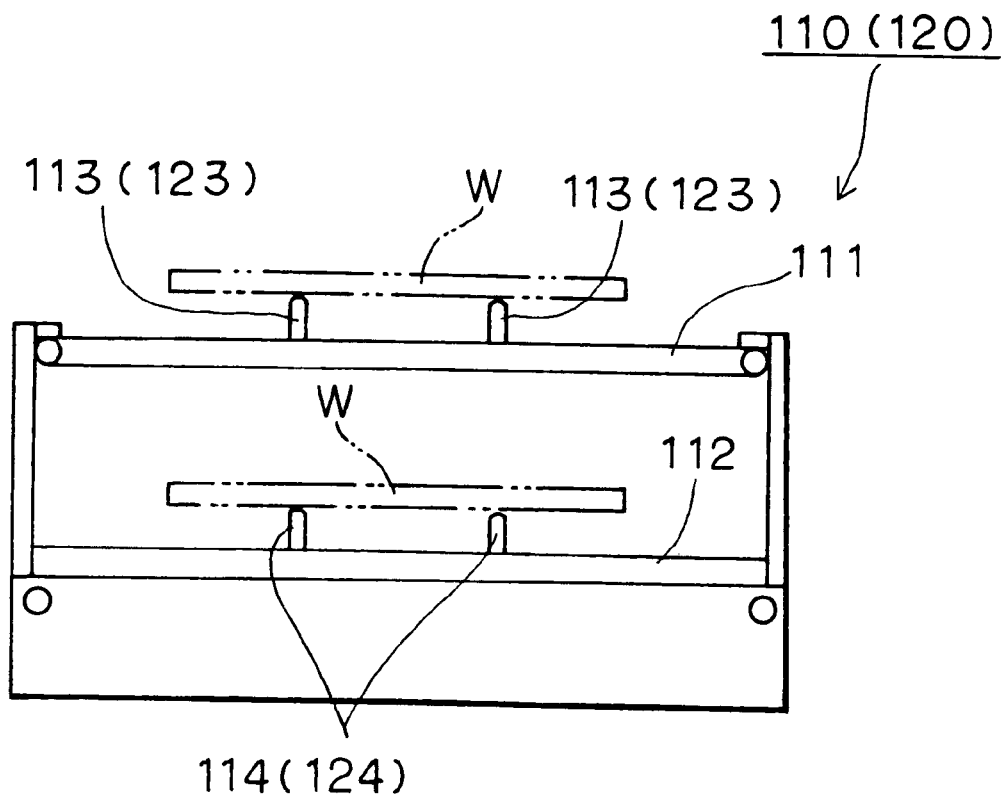
FIG. 6 is a sectional view for explaining a first transferring table of the coating and developing apparatus shown in FIG. 1.
Figure 9:
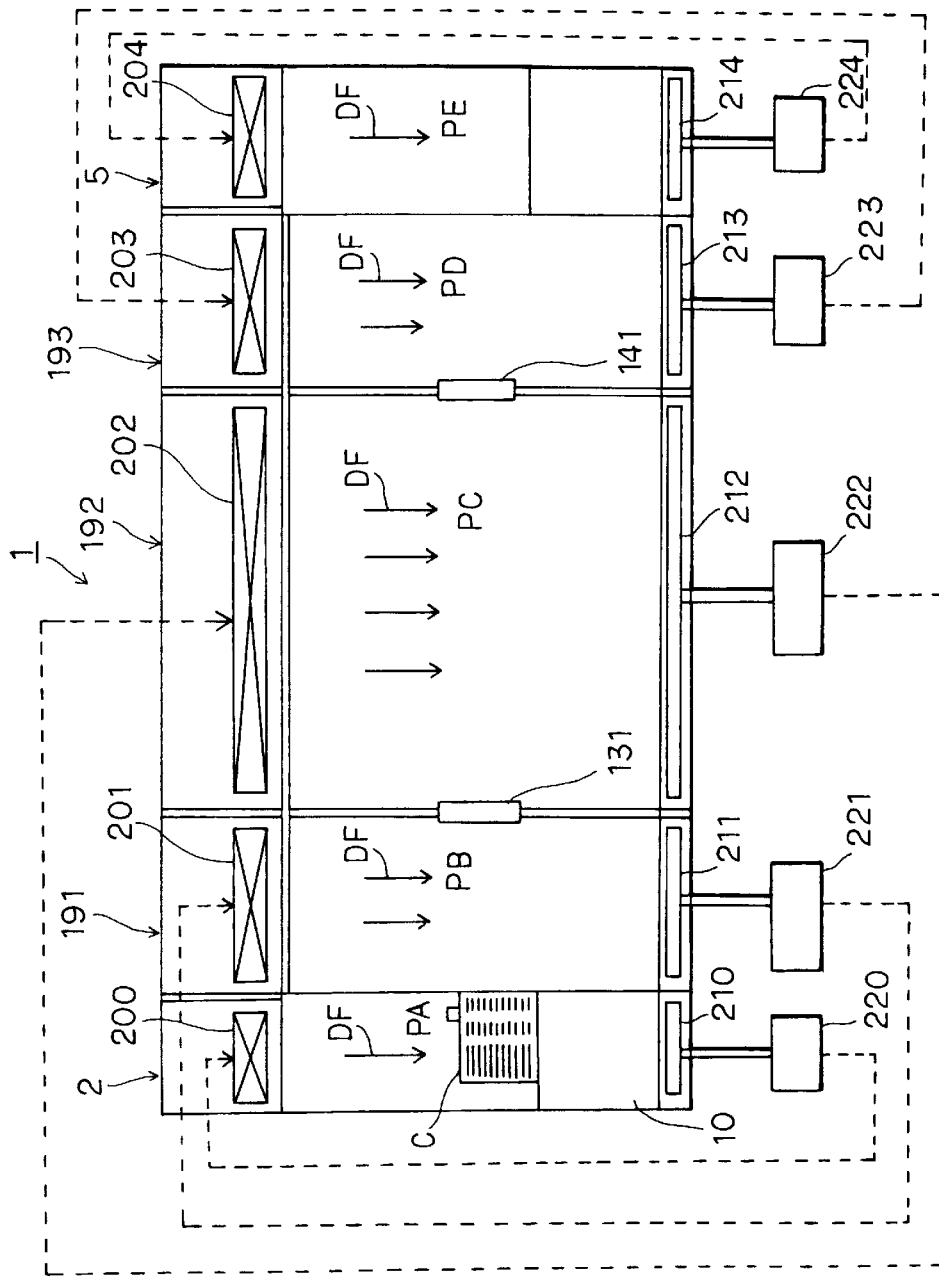
FIG. 9 is a sectional view for explaining the structure of an atmosphere controlling mechanism of the coating and developing apparatus shown in FIG. 1.

A first transferring table 110 is disposed between the first conveying unit 20 and the second conveying unit 30. A second transferring table 120 is disposed between the second conveying unit 30 and the third conveying unit 40. The structure of the first transferring table 110 is basically the same as the structure of the second transferring table 120. For simplicity, with reference to FIG. 6, the structure of the first transferring table 110 will be described. The first transferring table 110 has an upper table 111 and a lower table 112. The upper table 111 has, for example, three holding pins 113 that hold the rear surface of a wafer W. The lower table 112 has, for example, three holding pins that hold the rear surface of a wafer W. Thus, the first transferring table 110 holds a total of two wafers W with the holding pins 113 and 114. As with the first transferring table 110, the second transferring table 120 has upper supporting pins 123 and lower supporting pins 124.

The first conveying unit 20 conveys a wafer W among a cassette C on the cassette table 10, each heating treatment unit of the first heat treatment unit group 41 and the second heat treatment unit group 42, and the first transferring table 110. The second conveying unit 30 conveys a wafer W among each of the developing units 91, 92, 93, and 94 of the developing unit group 90, each of the resist coating units 101, 102, 103, and 104 of the resist coating unit group 100, and each of the transferring tables 110 and 120. The third conveying unit 40 conveys a wafer W among the interface portion 5, each of the heat treatment units of the third heat treatment unit group 43 and the fourth heat treatment unit group 44, and the second transferring table 120.

The first heat treatment unit group 41, the second heat treatment unit group 42, and the first conveying unit 20 are heat-insulated from the first transferring table 110 by an insulating plate 130. The insulating plate 130 has a wafer conveying opening through which a wafer W placed in the horizontal position is conveyed. Likewise, the third heat treatment unit group 43, the fourth heat treatment unit group 44, and the third conveying unit 40 are heat-insulated from the second transferring table 120 by an insulating plate 140. The insulating plate 140 has a wafer conveying opening through which a wafer placed in the horizontal position is conveyed. The wafer conveying openings 131 and 141 are opened and closed by respective shutters (not shown).

As described above, the coating and developing apparatus 1 according to the embodiment of the present invention is structured. Next, the operation and effect of the coating and developing apparatus 1 will be described.

When a cassette C that accommodates raw wafers W is placed on the cassette station 2, the first conveying unit 20 accesses the cassette C. The lower pincette 28 extracts one wafer W from the cassette C and holds it. The first conveying unit 20 conveys the wafer W to the hydrophobic processing unit 51 of the first heat treatment unit group 41 while holding the wafer W with the pincette 28.

After the wafer W has been processed in the hydrophobic processing unit 51, the upper pincette 27 of the first conveying unit 20 unloads the wafer W from the hydrophobic processing unit 51. The first conveying unit 20 conveys the wafer W to the cooling unit 50 of the first heat treatment unit group 41 or the cooling unit 70 of the second heat treatment unit group 42 while holding the wafer W with the upper pincette 27. The cooling unit 50 or 70 actively cools the wafer W. After the cooling unit 50 or 70 has cooled the wafer W, the pincette 28 unloads the wafer W from the cooling unit 50 or 70. Thereafter, the first conveying unit 50 conveys the wafer W to the first transferring table 110 while holding the wafer W with the pincette 28. At this point, the wafer W is held by the holding pins 113 on the upper table 111.

Next, the lower pincette 39 of the second conveying unit 30 unloads the wafer W from the upper table 111. The second conveying unit 30 conveys the wafer W to the resist coating unit group 100 while holding the wafer W with the pincette 39. For example, the resist coating unit 101 of the resist coating unit group 100 coats a resist solution to the wafer W. The upper pincette 37 of the second conveying unit 30 unloads the wafer W from the resist coating unit 101. The second conveying unit 30 conveys the wafer W to the second transferring table 120 while holding the wafer W with the pincette 37. At this point, the wafer W is held by the lower holding pins 124 on the second transferring table 120.

Thereafter, the pincette 48 of the third conveying unit 40 unloads the wafer W from the second transferring table 120. The third conveying unit 40 conveys the wafer W to one pre-baking unit 82 of the fourth heat treatment unit group 44 while holding the wafer W with the pincette 48. The pre-baking unit 82 performs a pre-exposure heating process for the wafer W. Thereafter, the pincette 48 loads the wafer W to the extension cooling unit 61. The extension cooling unit 61 naturally cools the wafer W. After the extension cooling unit 61 has cooled the wafer W, the pincette 47 of the third conveying unit 40 unloads the wafer W from the extension cooling unit 61. The third conveying unit 40 conveys the wafer W to the exposing unit 4 while holding the wafer W with the pincette 47.

After the exposing unit 4 has exposed the wafer W, the pincette 47 unloads the wafer W from the exposing unit 4. The third conveying unit 40 conveys the wafer W to the post-exposure baking unit 65 of the third heat treatment unit group 43 while holding the wafer W with the pincette 47. The post-exposure baking unit 65 performs a predetermined heating process for the wafer W. Thereafter, the third conveying unit 40 conveys the wafer W to one cooling unit 80 of the fourth heat treatment unit group 44 while holding the wafer W with the pincette 47. The cooling unit 80 actively cools the wafer W to a predetermined temperature. Thereafter, the third conveying unit 40 conveys the wafer W to the second transferring table 120 once again. At this point, the wafer W is held by the upper holding pins 123 on the second transferring table 120.

Next, the second conveying unit 30 conveys the wafer W from the second transferring table 120 to the developing process unit group 90 while holding the wafer W with the lower pincette 39. For example, the developing unit 91 of the developing unit group 90 performs a predetermined developing process for the wafer W. Thereafter, the second conveying unit 30 conveys the wafer W to the first transferring table 110 while holding the wafer W with the pincette 38. At this point, the wafer W is held by the holding pins 114 on the lower table 112 of the first transferring table 110.

The pincette 28 of the first conveying unit 20 unloads the wafer W from the first transferring table 110. The first conveying unit 20 conveys the wafer W to one post-baking unit 75 of the second heat treatment unit group 42 while holding the wafer W with the pincette 28. After the post-baking unit 75 has performed a predetermined heating process for the wafer W, the first conveying unit 20 conveys the wafer W to the cooling unit 73 of the second heat treatment unit group 42 while holding the wafer W with the pincette 27. The cooling unit 73 cools the wafer W to a predetermined temperature. Thereafter, the wafer W is placed in a cassette C on the cassette table 10. Thus, a sequence of coating and developing process steps for the wafer W is completed.

According to the above-described embodiment of the present invention, the first conveying unit 20 conveys a wafer that has been unloaded from each of the heating units of the first heat treatment unit group 41 and the second heat treatment unit group 42. The second conveying unit 30 conveys a wafer W that has been cooled by the cooling unit 50 of the first heat treatment unit group 41 and the cooling unit 63 of the third heat treatment unit group 43. The third conveying unit 40 conveys a wafer W that has been unloaded from each of the heating units of the third heat treatment unit group 43 and the fourth heat treatment unit group 44. Thus, the pincettes 37, 38, and 39 of the second conveying unit 30 do not hold a heated wafer W. Consequently, the pincettes 37, 38, and 39 do not heat up. As a result, the film thickness of a resist film formed on a wafer W conveyed by the second conveying unit 30 can be prevented from varying against heat.

In addition, the middle and lower pincettes 38 and 39 of the second conveying unit 30 do not heat up. Thus, the pincettes 38 and 39 do not generate heat radiation to the upper pincette 37. Consequently, since the pincette 37 does not heat up, a heat insulating member such as a heat insulating plate used in the conventional apparatus can be omitted. Thus, the second conveying unit 30 can be prevented from becoming large or complicated.

In the above-described embodiment, heat generated by the first heat treatment unit group 41 and the second heat treatment unit group 42 is insulated from the developing process unit group 90 and the resist coating unit group 100 by the insulating plate 130. In addition, heat generated by the third heat treatment unit group 43 and the fourth heat treatment unit group 44 is insulated from the developing unit group 90 and the resist coating unit group 100 by the insulating plate 140. Thus, heat generated by the heat treatment unit groups 41, 42, 43, and 44 is suppressed from being radiated to the developing unit group 90 and the resist coating unit group 100. Consequently, the resist coating unit group 61 performs a predetermined resist coating process in a preferable atmosphere free from temperature change. In addition, thermal variation of the film thickness of a resist film formed on a wafer W conveyed by the second conveying unit 30 is further suppressed.

The wafer conveying openings 131 and 141 of the insulating plates 130 and 140 are opened and closed by the respective shutters. In other words, except while a wafer W is being conveyed through the wafer conveying openings 131 and 141, they are usually closed. Thus, heat radiation due to atmosphere to the developing unit group 90 and the resist coating unit group 100 can be minimized.

Instead of the above-described transferring tables 110 and 120, transferring tables 150 shown in FIG. 7 may be used.

Each of the transferring table 150 has a cooling table 152. The cooling table 152 is disposed at the top of a casing 151. For example, three pins 155 are raised from respective holes 154 by a cylinder 153 disposed in the casing 151. The cooling table 152 has an inner water circulation path (not shown) that circulates water whose temperature is kept constant (for example, 23° C.).

With the transferring table 150 shown in FIG. 7, after a wafer W conveyed by the first conveying unit 20 or the third conveying unit 40 is held by the pins 155, when the pins 155 are lowered, the wafer W is placed on the cooling table 152. Thus, the cooling table 152 cools the wafer W. Consequently, the pincette 39 of the second conveying unit 30 can unload a wafer W that has been cooled from the cooling table 152 of the transferring table 150. As a result, heat of the wafer W is not transferred to the pincette 39. Thus, thermal variation of the film thickness of the resist film can be securely prevented. Consequently, the yield can be further securely prevented from lowering.

When a wafer W that has been heated by the post-exposure baking unit 65 is cooled by the transferring table 150, the cooling process of the cooling unit 80 of the fourth heat treatment unit group 44 can be omitted. Thus, the conveying process of the third conveying unit 40 that conveys a wafer W from the post-exposure baking unit 65 to the cooling unit 80 can be omitted. Thus, the throughput can be further improved.

In the example shown in FIG. 7, a wafer W is cooled by water whose temperature is kept constant, the water being circulated in a circulation path (not shown) of the cooling table 152. Alternatively, the cooling table 152 may have a Peltier device so as to cool the wafer W.

As another alternative method, as shown in FIG. 8, a transferring table 160 composed of two transferring tables 150 that are layered may be used. In the above-described embodiment, the apparatus processes wafers W as substrates. However, it should be noted that the apparatus may process LCD substrates.

Next, atmosphere such as inner pressures of the individual units shown in FIG. 5 will be described. In the individual blocks (namely, the cassette station 2, the first heat treatment block 191 (having the first heat treatment unit group 41 and the second heat treatment unit group 42), the developing and coating block 192 (having the developing process unit group 90 and the resist coating unit group 100), the second heat treatment block 193 (having the third heat treatment unit group 43 and the fourth heat treatment unit group 44), and the interface portion 5), down-flows DF are generated. The down-flows DF are generated at predetermined pressure levels in the blocks 2, 191, 192, 193, and 5 by FFUs 200, 201, 203, and 204 and down-flow collecting mechanisms 210, 211, 212, 213, and 214. The FFUs 200, 201, 203, and 204 are disposed at the upper positions of the blocks 2, 191, 192, 193, and 5, respectively. The down-flow collecting mechanisms 210, 211, 212, 213, and 214 are disposed at the lower positions of the blocks 2, 191, 192, 193, and 5, respectively.

The down-flow collecting mechanisms 210, 211, 212, 213, and 214 are connected to temperature/humidity controlling means 220, 221, 222, 223, and 224, respectively. Thus, the atmospheres of the blocks 2, 191, 192, 193, and 5 can be set to desired temperature and humidity. Air adjusted by the temperature/humidity controlling means 220, 221, 222, 223, and 214 is supplied to the FFUs 200, 201, 202, 203, and 204, respectively. The FFUs 200, 201, 202, 203, and 204 remove particular particles and/or particular organic matters and/or adjust air flow rates so that desired atmospheres of the blocks 2, 191, 192, 193, and 5 are obtained.

In such a manner, desired atmospheres are set in the blocks 2, 191, 192, 193, and 55. Next, preferable settings of atmospheres in the blocks 2, 191, 192, 193, and 55 will be described.

The inner pressure of the developing and coating block 192 (having the developing unit group 90 and the resist coating unit group 100) is denoted by PC. The inner pressure of the first heat treatment block 191 (having the first heat treatment unit group 41 and the second heat treatment unit group 42) is denoted by PB. The inner pressure of the second heat treatment block 193 (having the third heat treatment unit group 43 and the fourth heat treatment unit group 44) is denoted by PD. The inner pressure of the cassette station 2 is denoted by PA. The inner pressure of the interface portion 5 is denoted by PE. These inner pressures are set in such a manner that the inner pressure PC is the highest; each of the inner pressures PB and PD is lower than the inner pressure PC; each of the inner pressures PB and PD is lower than each of the inner pressures PA and PE.

In other words, with respect to the inner pressures of the individual blocks 2, 191, 192, 193, and 55, the following relation is satisfied.

PC>(PB or PD)>(PA or PE)

Thus, the atmosphere of the first heat treatment block 191 (having the first heat treatment unit group 41 and the second heat treatment unit group 42) or the second heat treatment block 193 (having the third heat treatment unit group 43 and the fourth heat treatment unit group 44) does not interfere with the atmosphere of the developing and coating block 192.

Since the processes of the developing and coating block 192 are not affected by heat, the processes can be equally performed. Thus, the yield can be improved. In addition, the atmosphere of the cassette station 2 or the interface portion 5 does not interfere with the atmosphere of the first heat treatment block 191 or the second heat treatment block 193. Thus, particles in air can be prevented from entering into the first heat treatment block 191 or the second heat treatment block 193. In particular, after the processes of the developing and coating block 192 have been performed, dust and so forth can be prevented from adhering to a wafer W that has not been heat-treated. Thus, since the heating treatment can be equally performed, the yield can be improved.

In addition, the inner pressure PA of the cassette station 2 is higher than the inner pressure of the installed place of the apparatus (for example, a clean room). Thus, particles and so forth can be prevented from entering into the apparatus.

Although the inner pressure PE of the interface portion 5 is lower than the inner pressure PD of the second heat treatment block 193 (having the third heat treatment unit group 43 and the fourth heat treatment unit group 44), since the interface portion 5 is connected to another unit (for example, an exposing unit), the inner pressure PE of the interface portion 5 may depend on the unit connected thereto.

In the case that the interface portion 5 is connected to an exposing unit, to prevent the atmosphere of the interface portion 5 from entering into the exposing unit, the inner pressure PE of the interface portion 5 may be set so that it is lower than the inner pressure of the exposing unit.

When the influence of heat is further considered, as was described above, it is clear that the inner pressure PC of the developing and coating block (solution processing block) 192 is higher than the inner pressure of each of the first heat treatment block 191 and the second heat treatment block 193 (heat treatment block). In the first heat treatment block 191 and the second heat treatment block 193, the first heat treatment unit group 191 (having the first heat treatment unit group 41 and the second heat treatment unit group 42) and/or the second heat treatment unit group 193 (having the third heat treatment unit group 43 and the fourth heat treatment unit group 44) may be structured corresponding to the type of heat.

In other words, the first heat treatment unit group 41 and the second heat treatment unit group 42 of the first heat treatment block 19 may be composed of a heating unit and a cooling unit (that cools a wafer to the temperature for the developing and coating process block), respectively.

Thus, heat can be suppressed from interfering in the first heat treatment block 191 and/or the second heat treatment block 193. Consequently, the processes of the blocks can be equally performed. As a result, the yield can be improved.

Next, the influence of particles will be further described. As described above, the first transferring unit 110 and the second transferring unit 120 that transfer a wafer W with the first conveying unit 20 and the third conveying unit 40 of the first heat treatment block 191 and/or the second heat treatment block 193 are disposed in the developing and coating block (solution process block) whose inner pressure is the highest in the apparatus. Thus, while a wafer W is temporarily being held by a transferring table, the wafer W is suppressed from being affected by heat and particles. Consequently, the yield can be improved.

As described above, as a major effect of the present invention, since heat is not stored in the holding member of the second conveying unit, a film of process solution formed on a substrate is not affected by heat of the holding member. Consequently, thermal variation of the film thickness of the film of the processing solution formed on the substrate can be suppressed. Thus, the yield can be prevented from lowering. In addition, unlike with the conventional apparatus, since a heat insulating member such as a heat insulating plate is not required, the second conveying unit can be prevented from becoming large and complicated.

In addition, since a plurality of heat treatment units and a plurality of solution processing units are disposed, the throughput and processing capability of substrates can be improved.

In addition, the insulating plates prevent heat generated in each heat treatment unit from transferring to the solution processing unit side. Thus, the temperature of the solution processing unit can be more securely prevented from varying. Consequently, the film thickness can be more securely prevented from varying.

In addition, a plurality of table members of a transferring table allow each conveying unit to smoothly convey a substrate. Thus, the throughput can be prevented from lowering.

In addition, since the holding member of the second conveying unit holds a substrate cooled by a table member, the holding member of the second conveying unit does not heat up. Thus, the holding member does not affect a film on a substrate. Consequently, the yield can be more securely prevented from lowering.

In addition, a substrate heated by a heating unit is conveyed by the conveying units disposed in the first heat treatment block and the second heat treatment block through a transferring table. Thus, the heat of the substrate does not directly affect the conveying unit of the developing and coating block.

Thus, thermal variation of the film thickness of a film of process solution formed on a substrate can be suppressed. Consequently, the yield can be prevented from lowering.

Since the inner pressure of the developing and coating block is higher than the inner pressure of each of the first heat treatment block and the second heat treatment block, the atmosphere of each of the first heat treatment block and the second heat treatment block is prevented from entering into the developing and coating block, the film thickness of a film of processing solution in the developing and coating block can be more securely prevented from varying against heat.

In addition, heat of a substrate processed by the first heat treatment block and/or the second heat treatment block does not directly influence the conveying unit of the developing and coating block. After a substrate is cooled to a predetermined temperature, the conveying unit of the developing and coating block conveys the substrate. Thus, the conveying unit can convey the substrate to the solution processing unit of the developing and coating block in such a manner that the conveying unit does not influence the solution processing unit.

Thus, thermal variation of the film thickness of a film of processing solution in the developing and coating process block can be more securely prevented. Consequently, processes for substrates can be equally performed. As a result, the yield can be further improved.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A substrate processing apparatus, comprising;
   at least one solution processing unit that supplies a process solution to a substrate and processes the substrate with the supplied solution;
   at least one heat treatment unit that heat-treats the substrate at a predetermined temperature; and
   a first and second conveying unit that conveys the substrate while holding the substrate with a holding member;
   wherein said first conveying unit transports the substrate exclusively between a transferring table and said heat treatment unit;
   said second conveying unit transports the substrate exclusively between said transferring table and said solution processing unit, and
   wherein said transferring table is disposed between said first conveying unit and said second conveying unit.

2. The substrate apparatus as set forth on claim 1,
   wherein said solution processing unit is composed of a plurality of solution processing units that are layered,
   wherein said treatment unit is composed of a plurality of heat treatment units that are layered, and
   wherein said transferring table is composed of a plurality of transferring units that are disposed in a vertical direction.

3. The substrate processing apparatus as set forth in claim 2,
   wherein said solution processing units and said transferring tables are disposed in a common atmosphere, and
   wherein said solution processing units and said transferring tables is disposed in an atmosphere different from the atmosphere of said heat treatment units.

4. The substrate processing apparatus as set forth in claim 2,
   wherein said solution processing units and said transferring tables are disposed in a common atmosphere of the same pressure, and
   wherein said solution processing units and said transferring tables are disposed in an atmosphere of a higher pressure than said heat treatment units.

5. The substrate processing apparatus as set forth in claim 3, further comprising:
   an opening/closing mechanism for causing an installation space for said processing units and said transferring tables to be opened and closed against an installation space for said heat treatment units.

6. A substrate processing apparatus, comprising:
   a first solution processing unit and a second solution processing unit for supplying a processing solution to a substrate and for processing the substrate with the processing solution;
   a first heat treatment unit group, a second heat treatment unit group, a third heat treatment unit group, and a fourth heat treatment unit group, each composed of a plurality of heat treatment units, for heat-treating substrates at respective predetermined temperatures; and
   a first conveying unit, a second conveying unit, and a third conveying unit for conveying respective substrates while holding the substrates with respective holding members,
   wherein said first heat treatment unit group and said second heat treatment unit group are oppositely disposed respect to with said first conveying unit,
   wherein said first solution process unit and said second solution process unit are oppositely disposed with respect to said second conveying unit,
   wherein said third heat treatment unit group and said fourth heat treatment unit group are oppositely disposed with respect to said third conveying unit,
   wherein a first transferring table is disposed between said first conveying unit and said second conveying unit,
   wherein a second transferring table is disposed between said second conveying unit and said third conveying unit,
   wherein said first conveying unit conveys a substrate among each heat treatment unit of said first heat treatment unit group, each heat treatment unit of said second heat treatment unit group, and the first transferring table,
   wherein said second conveying unit conveys a substrate among said first solution processing unit, said second solution processing unit, said first transferring table, and said second transferring table, and
   wherein said third conveying unit conveys a substrate among each heat treatment unit of said third heat treatment unit group, each heat treatment unit of said fourth heat treatment unit group, and said second transferring table.

7. The substrate processing apparatus as set forth in claim 6,
   wherein said first solution processing unit group is composed of a plurality of solution processing units that are layered, and
   wherein said second solution processing unit group is composed of a plurality of solution processing units that are layered.

8. The substrate processing apparatus as set forth in claim 6, wherein at least one heat insulating portion is disposed between an installation space for said first solution process unit and said second solution process unit and an installation space for said first heat treatment unit group and said second heat treatment unit group and/or between the installation space for said first solution processing unit and said second solution process unit and the installation space for said third heat treatment unit group and said fourth heat treatment unit group, the heat insulating portion suppressing transfer of heat.

9. The substrate processing apparatus as set forth in claim 8, wherein at least one of the first transferring table and the second transferring table has a plurality of mounting portions for holding substrates.

10. The substrate processing apparatus as set forth in claim 9, wherein at least one of the first transferring table and the second transferring table has a means for cooling a substrate.

11. The substrate processing apparatus as set forth in claim 10, wherein the first transferring table or the second transferring table is composed of a plurality of transferring tables disposed in a vertical direction.

12. The substrate processing apparatus as set forth in claim 6, wherein said first solution processing unit, said second solution processing unit, and at least one of the first transferring table and the second transferring table are disposed in a common atmosphere, and wherein said first solution processing unit, said second solution processing unit, and at least one of the first transferring table and the second transferring table are disposed in an atmosphere different from at least one of the atmosphere of said first heat treatment unit group, said second heat treatment unit group and the atmosphere of said third heat treatment unit group and said fourth heat treatment unit group.

13. The substrate processing apparatus as set forth in claim 6, wherein said first solution processing unit, said second solution processing unit, and at least one of the first transferring table and the second transferring table are disposed in an atmosphere of the same pressure, and wherein said first solution processing unit, said second solution processing unit, and at least one of the first transferring table and the second transferring table are disposed in an atmosphere of a higher pressure than at least one of the atmosphere of said first heat treatment unit group and said second heat treatment unit group and the atmosphere of said third heat treatment unit group and said fourth heat treatment unit group.

14. A substrate processing apparatus, comprising:

a developing and coating block having a plurality of solution processing units;

a first heat treatment block and a second heat treatment block disposed on opposite sides of said developing and coating block, each of said first heat treatment block and said second heat treatment block having a plurality of heat treatment units;

a first conveying unit disposed in said first heat treatment block;

a second conveying unit disposed in said second heat treatment block;

a third conveying unit disposed in said developing and coating block; and a first transferring table for transferring a substrate between said third conveying unit disposed in said developing and coating block and said first conveying unit disposed in said first heat treatment block; and a second transferring table for transferring said substrate between said third conveying unit disposed in said developing and coating block and said second conveying unit disposed in said second heat treatment block;

wherein said developing and coating block has an inner pressure which is higher than an inner pressure of at least one of said first heat treatment block and said second heat treatment block.

15. The substrate processing apparatus as set forth in claim 14, further comprising:

at least one opening/closing mechanism disposed between said developing and coating block and said first heat treatment block and between said developing and coating block and said second heat treatment block.

16. The substrate processing apparatus as set forth in claim 14, wherein said first transferring table and said second transferring table have a means for cooling a substrate.

17. Substrate processing apparatus comprising:

at least one solution processing unit that supplies a process solution to a substrate and processes the substrate with the supplied solution;

at least one heat treatment unit that heat-treats the substrate at a predetermined temperature; and a first and second conveying unit that conveys the substrate while holding the substrate with a holding member;

wherein said first conveying unit transports the substrate between a transferring table and said heat treatment unit;

said second conveying unit transports the substrate between said transferring table and said solution processing unit;

wherein said transferring table is disposed between said first conveying unit and said second conveying unit; and an insulating plate provided between said solution processing unit and said heat treatment unit to provide an openable partition between the solution processing unit and the heat treatment unit, said transferring table being located on a side of said solution processing unit with respect to said insulating plate.

18. A substrate processing apparatus, comprising:

a developing and coating block having a plurality of solution processing units;

a first heat treatment block and a second heat treatment block disposed on opposite sides of said developing and coating block, each of said first heat treatment block and said second heat treatment block having a plurality of heat treatment units;

a first conveying unit disposed in said first heat treatment block;

a second conveying unit disposed in said second heat treatment block;

a third conveying unit disposed in said developing and coating block; and a first transferring table for transferring a substrate between said third conveying unit disposed in said developing and coating block and said first conveying unit disposed in said first heat treatment block;

a second transferring table for transferring said substrate between said third conveying unit disposed in said developing and coating block and said second conveying unit disposed in said second heat treatment block;

a first insulating plate provided between said first heat block and said developing and coating block to provide a first openable partition between the first heat block and the developing and coating block; and a second insulating plate provided between said second heat block and said developing and coating block to provide a second openable partition between the second heat block and the developing and coating block.

19. The substrate processing apparatus as set forth in claim 18, wherein said first second transferring tables are located within said developing and coating block.

* * * * *